(12) United States Patent
Etter

(10) Patent No.: US 10,975,682 B2
(45) Date of Patent: Apr. 13, 2021

(54) SYSTEMS AND METHODS FOR DETERMINING RESISTANCE OF A POWER CABLE CONNECTED TO A DOWNHOLE MOTOR

(71) Applicant: Nathan A Etter, Broken Arrow, OK (US)

(72) Inventor: Nathan A Etter, Broken Arrow, OK (US)

(73) Assignee: BAKER HUGHES, A GE COMPANY, LLC, Houston, TX (US)

( * ) Notice: Subject to any disclaimer, the term of this patent is extended or adjusted under 35 U.S.C. 154(b) by 253 days.

(21) Appl. No.: 15/969,524

(22) Filed: May 2, 2018

(65) Prior Publication Data

US 2019/0085682 A1    Mar. 21, 2019

Related U.S. Application Data

(60) Provisional application No. 62/560,743, filed on Sep. 20, 2017.

(51) Int. Cl.
*E21B 47/008* (2012.01)
*E21B 43/12* (2006.01)
(Continued)

(52) U.S. Cl.
CPC .......... *E21B 47/008* (2020.05); *E21B 43/128* (2013.01); *E21B 47/06* (2013.01);
(Continued)

(58) Field of Classification Search
CPC .... E21B 47/0007; E21B 47/06; E21B 47/065; E21B 43/128; E21B 47/008; E21B 47/07;
(Continued)

(56) References Cited

U.S. PATENT DOCUMENTS 3,327,791 A    6/1967 Harrigan
4,178,579 A    12/1979 McGibbeny
(Continued)

FOREIGN PATENT DOCUMENTS

CA    1194405    10/1985

OTHER PUBLICATIONS

Editor "Understanding DC Motor Curves and Temperature"; Motion Control Tips (Nov. 7, 2013) (Year: 2013).*
(Continued)

*Primary Examiner* — George S Gray
(74) *Attorney, Agent, or Firm* — Sprinkle IP Law Group

(57) ABSTRACT

Systems and methods for determining the resistance of a power cable of an ESP. The nameplate resistance of the motor is determined prior to installation of the ESP in the well, and the temperature is determined for a point in the well at which the motor will be positioned. The downhole temperature and nameplate resistance are used to calculate an initial downhole resistance of the motor. After the ESP is installed, but before operation of the ESP is initiated, the electric drive for the system generates a measurement voltage and applies the measurement voltage to the power cable and motor. The corresponding current is then measured and is used to calculate the resistance of the string (the combined power cable and motor). The calculated initial downhole resistance of the motor is then subtracted from the resistance of the string to obtain the resistance of the power cable.

15 Claims, 4 Drawing Sheets

(51) Int. Cl.
*F04B 47/06* (2006.01)
*G01R 31/34* (2020.01)
*G01R 27/16* (2006.01)
*E21B 47/06* (2012.01)
*F04B 17/03* (2006.01)
*F04B 49/06* (2006.01)
*E21B 47/07* (2012.01)

(52) U.S. Cl.
CPC .............. *E21B 47/07* (2020.05); *F04B 17/03* (2013.01); *F04B 47/06* (2013.01); *F04B 49/06* (2013.01); *G01R 27/16* (2013.01); *G01R 31/34* (2013.01)

(58) Field of Classification Search
CPC .......... F04B 49/06; F04B 17/03; F04B 47/06; G01R 31/34; G01R 27/16
See application file for complete search history.

(56) References Cited

U.S. PATENT DOCUMENTS

| | | |
|---|---|---|
| 4,811,598 A | 3/1989 | Dillier |
| 4,901,070 A | 2/1990 | Vandevier |
| 5,539,375 A | 7/1996 | Atherton |
| 5,947,198 A | 9/1999 | McKee |
| 8,988,030 B2 | 3/2015 | Hernandez Marti |
| 9,127,534 B2 | 9/2015 | Payne |
| 2010/0228502 A1* | 9/2010 | Atherton ............. F04D 15/0088 702/47 |
| 2017/0089192 A1 | 3/2017 | Rendusara |

OTHER PUBLICATIONS

Editor—Understanding DC Motor Curves and Temperature—Motor Control Tips—(Nov. 7, 2013) (Year: 2013).*

* cited by examiner

SYSTEMS AND METHODS FOR DETERMINING RESISTANCE OF A POWER CABLE CONNECTED TO A DOWNHOLE MOTOR

CROSS-REFERENCE TO RELATED APPLICATIONS

This application claims the benefit of U.S. Provisional Patent Application 62/560,743, filed Sep. 20, 2017 by Nathan A. Etter, which is incorporated by reference as if set forth herein in its entirety.

BACKGROUND

Field of the Invention

The invention relates generally to electric motors, and more particularly to systems and methods for determining the resistance of a power cable that is coupled between a power source and an electric motor such as may be used in applications of an electric submersible pump system (ESP), where the power cable may be thousands of feet long and may have varying temperatures along its length.

Related Art

Artificial lift systems (for example, electric submersible pump, or ESP, systems) are often used to produce fluids such as oil from underground reservoirs. The artificial lift systems may be installed in wells that are thousands of feet deep. Typically, power for the electric motor in an artificial lift system is supplied by an electric drive that is positioned at the surface of the well, and is supplied to the motor via a power cable that extends from the electric drive at the surface to the motor which is positioned in a producing region of the well.

The power generated by the electric drive can be controlled so that the motor and pump of the artificial lift system are operated in a desired manner. In order to operate the motor in the desired manner, it is typically necessary to provide power at a desired frequency and voltage. Because the power generated by the electric drive must be delivered to the motor via a power cable that is thousands of feet long and therefore has a significant amount of resistance, it is necessary to account for the voltage drop across the power cable. In other words, the electric drive must generate power at a voltage that includes both the voltage intended to be provided to the motor and the voltage drop across the cable.

Conventionally, the voltage drop across the power cable is calculated based upon specifications provided by the cable manufacturer, such as the resistance of the cable per kilofoot at particular temperatures. If it is assumed that the power cable has a particular temperature profile along its length, the resistance (versus temperature) information provided by the manufacturer can be used to compute the total resistance of the cable between the electric drive at the surface of the well and the electric motor positioned downhole in the well. This resistance can then be used to compute a voltage drop across the cable. The temperature profile of the cable, however, may not be accurately known, and the resistance may be affected by other factors, such as the presence of intermediate splices or connectors. It is therefore difficult to accurately determine the total cable resistance and resulting voltage drop using conventional methods.

SUMMARY OF THE INVENTION

This disclosure is directed to systems and methods for determining the resistance of a power cable that is coupled between a power source and an electric motor, such as where the motor of an ESP installed in a well is connected by a power cable to an electric drive that is located at the surface of the well.

One embodiment comprises a method for determining the resistance of a power cable of an ESP. In this method, the nameplate resistance of the motor is determined prior to installation of the ESP in the well. Additionally, the temperature is determined for a point in the well at which the motor will be positioned. This may be determined prior to installation of the ESP in the well, or the ESP may include sensors that allow the temperature to be measured. The downhole temperature and nameplate resistance of the motor are used to calculate an initial downhole resistance of the motor. After the ESP is installed, but before operation of the ESP is initiated, the electric drive for the system generates a measurement voltage and applies the measurement voltage to the power cable and motor. The corresponding current is then measured and is used to calculate the resistance of the string (the combined power cable and motor). The calculated initial downhole resistance of the motor is then subtracted from the resistance of the string to obtain the resistance of the power cable. Because the power cable resistance is known, the voltage drop across the power cable can be easily determined by multiplying the cable resistance by the current through the cable. The electric drive can then adjust the voltage of the power it generates so that the voltage at the motor (generated voltage—cable voltage drop) is at a desired level.

Another embodiment comprises an artificial lift system having a pump, a motor coupled to drive the pump, an electric drive, and a power cable coupled between the electric drive and the motor. The electric drive is configured to generate output power that is transmitted to the motor via the power cable. The electric drive includes a controller that receives various inputs, including a pre-operation total string resistance of the combined power cable and motor, a nameplate resistance of the motor, a nameplate temperature of the motor, a temperature coefficient of a winding material of the motor, and a pre-operation downhole temperature at a location in a well at which the motor is installed. The controller is configured to compute a pre-operation downhole resistance of the motor, and to compute a power cable resistance as the pre-operation total string resistance, minus the pre-operation downhole resistance of the motor. After the controller has computed the power cable resistance, the controller generates the output power in dependence upon the power cable resistance.

Numerous other embodiments are also possible.

The various embodiments of the invention may provide a number of benefits over conventional systems and methods. For example, embodiments of the invention can accurately measure cable resistance regardless of temperature distribution, cable type, length, conductor materials, connections, and splices. Conventional systems and methods, on the other hand, require that a user determine the cable length and type, and then calculate the resistance based on cable characteristics provided by the cable manufacturer for this type of cable. These conventional systems and methods do not compensate for temperature distribution throughout the cable, splices, junction box connections, or other site-specific condition, as can the present embodiments. Additionally, embodiments of the present invention require minimal steps to complete, and may make use of measurements such as string resistance that are already made by field service technicians in the course of checking downhole tool integrity prior to startup. Field service technicians may also enter motor nameplate ratings into the controller as part of commissioning and startup procedures.

BRIEF DESCRIPTION OF THE DRAWINGS

Other objects and advantages of the invention may become apparent upon reading the following detailed description and upon reference to the accompanying drawings.

Figure 1:
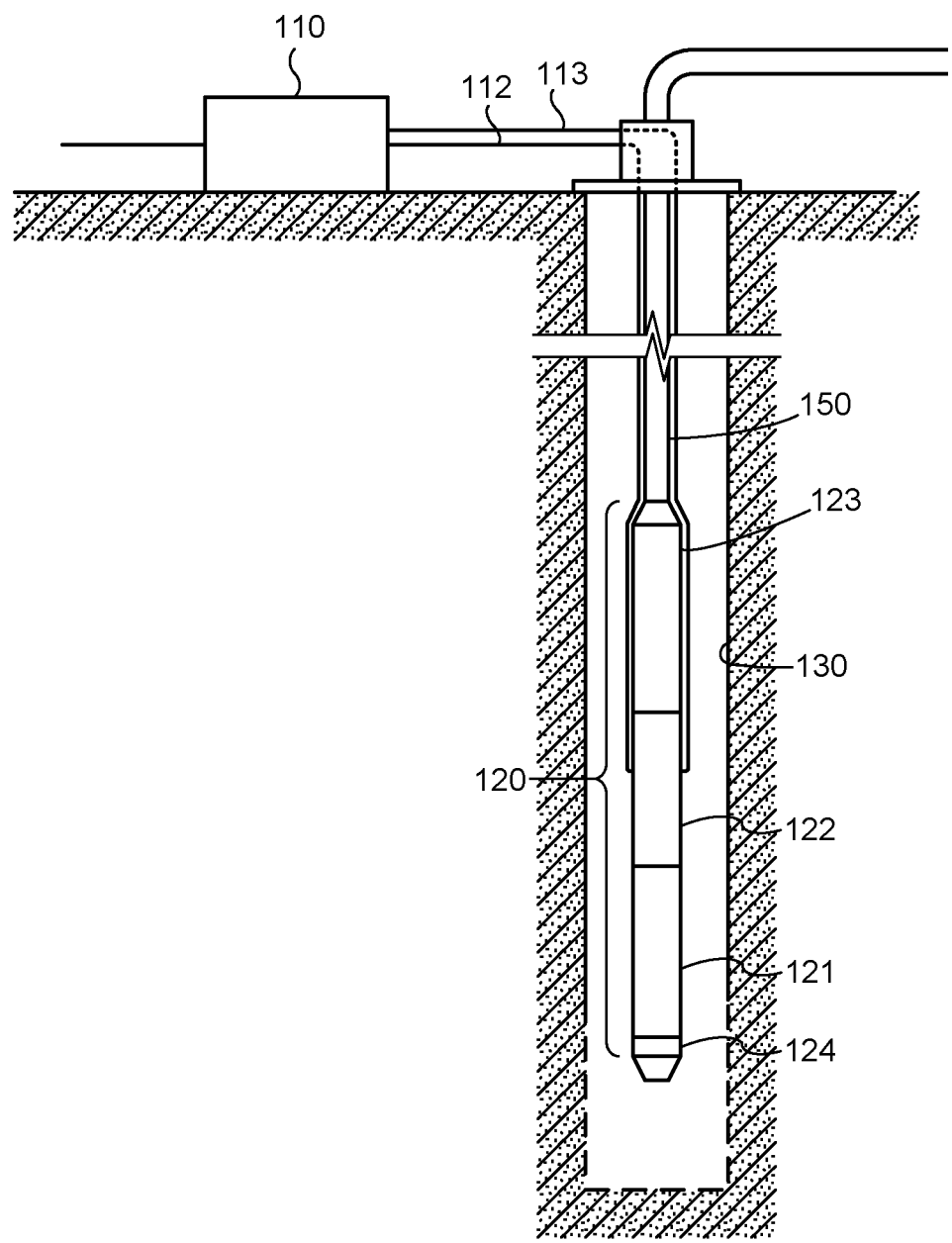
FIG. 1 is a diagram illustrating an exemplary ESP system in accordance with one embodiment.

While the invention is subject to various modifications and alternative forms, specific embodiments thereof are shown by way of example in the drawings and the accompanying detailed description. It should be understood, however, that the drawings and detailed description are not intended to limit the invention to the particular embodiment which is described. This disclosure is instead intended to cover all modifications, equivalents and alternatives falling within the scope of the present invention as defined by the appended claims. Further, the drawings may not be to scale, and may exaggerate one or more components in order to facilitate an understanding of the various features described herein.

DETAILED DESCRIPTION OF EXEMPLARY EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods for determining the resistance of a power cable for a system such as an ESP which utilize a downhole motor, where the cable may be very long and it may be very difficult to directly measure or accurately calculate the cable's resistance. These systems and methods utilize information about the motor and the downhole temperature to calculate the cable resistance from a measured resistance of the cable/motor string.

One embodiment is a method for determining the resistance of a power cable of an artificial lift system such as ESP. In this embodiment, the nameplate resistance and nameplate temperature of the motor is determined prior to its installation in the well. The temperature of the well at the location of installation of the motor is determined prior to installation of the system, or via sensors in the system after installation. The downhole temperature and nameplate resistance of the motor are used to calculate an initial resistance of the installed motor. After the motor and power cable are installed, but before beginning operation of the ESP (so that the temperature of the motor is not increased by the heat it generates), the resistance of the string including the power cable and motor is measured. The initial resistance of the installed motor is then subtracted from the resistance of the string to obtain the resistance of the power cable. The power cable resistance can then be used to determine a voltage drop across the power cable when the system is in operation. The electric drive can then control its output voltage so that the voltage at the motor (the output voltage, minus the cable voltage drop) is at a desired level.

Embodiments of the invention may be implemented in motors that are used in many different applications. An exemplary embodiment will be discussed in the context of a motor that is used in an ESP system. The invention is not, however, limited to use in ESP systems.

Referring to FIG. 1, a diagram illustrating an exemplary ESP system in accordance with one embodiment of the present invention is shown. A wellbore 130 is drilled into an oil-bearing geological structure and is cased. Pump system 120 is positioned in the producing region of the well. Pump system 120 is coupled to production tubing 150, through which the system pumps oil out of the well. An electric drive system 110 is positioned at the surface of the well. Drive system 110 is coupled to pump system 120 by power cable 112. A set of electrical data lines 113 may carry various types of sensed data and control information between the downhole pump system and the drive system at the surface, although this is not necessary for embodiments of the present invention.

Pump 120 includes an electric motor section 121, a seal section 122 and a pump section 123. A gauge package 124 may be connected to the bottom of motor section 121, and may include sensors to measure the temperature, pressure, and other operating conditions at the point in the well where pump 120 is installed. Pump system 120 may include various other components which will not be described in detail here because they are well known in the art and are not important to a discussion of the invention.

Motor section 121 receives power from electric drive system 110 and drives pump section 123, which pumps the oil through the production tubing and out of the well. Electric motor section 121 may be designed to use a rotary motor or a linear motor, depending upon the application. Electric drive system 110 receives AC (alternating current) input power from an external source such as a generator or poser grid, rectifies the AC input power to produce DC (direct current) power, and then inverts the DC power to produce three-phase AC output power which is suitable to drive the motor. The output power generated by drive system 110 is provided to pump system 120 via power cable 112.

Figure 2:
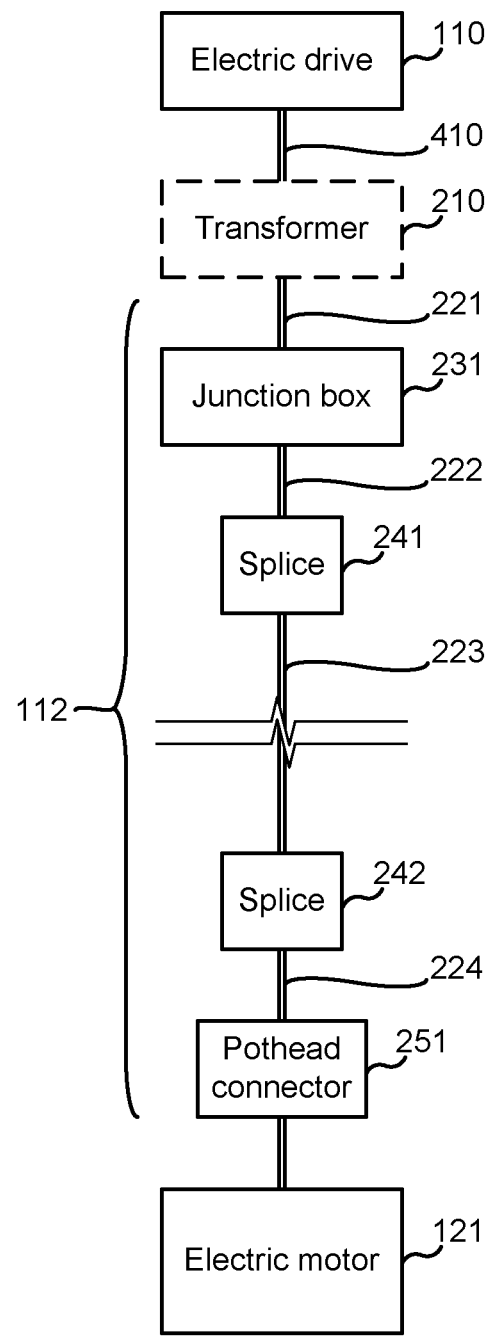
FIG. 2 is a diagram illustrating the string of electrical components to which power are provided by the electric drive system in accordance with one embodiment.

Referring to FIG. 2, a diagram is shown illustrating the string of electrical components to which power are provided by the electric drive system. The figure is intended to be representative of the different artificial lift systems with which embodiments of the invention may be used, but should not be considered limiting. As depicted in this embodiment, electric drive system 110 is connected to a step-up transformer 210. The output of electric drive system 110, which may be 480V in one embodiment, is stepped up to a higher voltage (2800V, for example) for transmission via the power cable to the motor section of the ESP's pump. (The step-up transformer may not be necessary in some applications.) Cable 112 may have multiple sections that are spliced or joined together. In the example of FIG. 2, cable section 221 is coupled to cable section 222 at a junction box 231. Cable section 222 is connected to cable section 223 at splice 241, and section 223 is connected to cable section 224 (which may be a motor lead extension) at splice 242. Cable section 224 is coupled to a pothead connector 251, which is secured to the motor to electrically connect cable 112 to the motor winding leads of electric motor section 121.

The electrical connections between the components of power cable 112 are made as the system is installed in the well. For instance, the windings of the motor are coupled to the motor lead extensions via the pothead connector, then the motor is lowered into the well. Splices are made as needed between cable sections as the system is lowered further into the well, and so on. When the system has been lowered to the point that the pump (including the motor) has reached the desired position, the resistance of the whole string (including the cable and its components, and the motor) can be measured. Since the temperature along the length/depth of the well varies, It may be desirable to allow the temperature of the cable and motor to stabilize after the motor reaches its final position.

Figure 3:
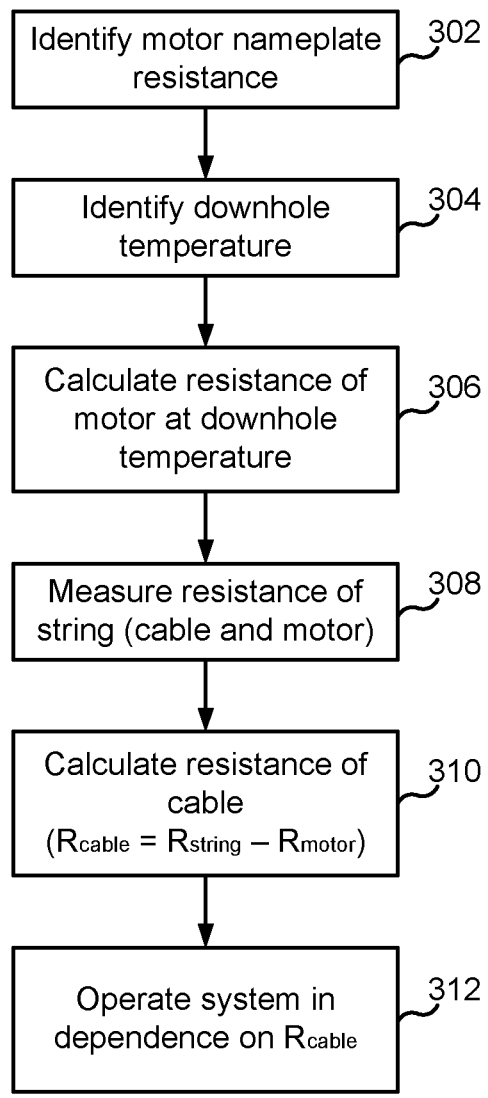
FIG. 3 is a flowchart illustrating a method for determining the resistance of the power cable in accordance with one embodiment.

Referring to FIG. 3, a flowchart illustrating a method for determining the resistance of the power cable in accordance with one embodiment is shown. In this embodiment, the nameplate resistance of the motor is determined prior to installation of the motor in the well (302). The "nameplate" ratings for the motor include a set of values for operating parameters such as resistance, frequency, voltage, current, horsepower, etc. that are determined for a motor when it is manufactured and are identified on a nameplate that is attached to the motor. The nameplate typically also identifies a reference temperature at which the motor has that specified nameplate resistance. It is also necessary in this method to determine the downhole temperature at the position at which the motor will be installed in the well. This temperature may be determined in a number of different ways. For example, after the well is drilled, but before installation of the artificial lift system, a tool may be run into the well for the purpose of determining well conditions, including the temperature. Alternatively, it is common for a gauge package to be attached to the bottom of the electric motor of an artificial lift system, so temperature sensors in the gauge package may be used to measure the temperature of the motor after it has been installed in the well.

The resistance of the installed motor is then determined (306). Because the temperature of the well at the position of the installed motor is normally much higher than the reference temperature at which the motor's nameplate resistance is determined, it is necessary to calculate the resistance of the motor at this higher temperature. The resistance of the installed motor is determined using the equation:

$$R_{motor}=R_{nameplate}(1+\alpha(\theta_{downhole}-\theta_{nameplate}))$$

where $R_{motor}$ is the computed downhole resistance of the installed motor, is $R_{nameplate}$ is the nameplate resistance of the installed motor at the nameplate temperature, $\alpha$ is is the temperature coefficient of the motor winding material (which is typically copper), $\theta_{downhole}$ is the downhole temperature of the installed motor, and $\theta_{nameplate}$ is the reference temperature associated with the nameplate motor resistance (which is typically room temperature).

After the motor and the power cable have been installed in the well, the resistance of the entire string (including the motor and the cable, with all of its associated components) is measured (308). This may be done, for example, using a simple ohmmeter. As noted above, it may be preferable to allow the temperatures of the power cable and the motor to stabilize prior to measuring the total resistance of the string. The resistance of the cable is then determined by subtracting the resistance of the installed motor from the measured resistance of the string (310):

$$R_{cable}=R_{string}-R_{motor}$$

where $R_{cable}$ is the resistance of the power cable, $R_{string}$ is the measured resistance of the string including the power cable and the motor, and $R_{motor}$ is the computed downhole resistance of the installed motor.

After the resistance of the power cable has been determined, it can be used by the system in a number of ways. For example, in one embodiment that does not have a step-up transformer between the drive and motor, the resistance of the string (the power cable and the motor) can be measured at different times during the operation of the system. As the system is operated, the magnetic windings of the electric motor dissipate a great deal of heat into a relatively small volume, causing the temperature of the motor to increase significantly (e.g. by hundreds of degrees). As the temperature of the motor (and its windings) increases, the resistance of the motor increases as well. Because the power cable dissipates heat into a much larger volume than the motor, the temperature of the cable typically does not increase significantly. Compared to the temperature increase of the motor, the temperature increase of the power cable is negligible. Consequently, the initially determined resistance of the power cable can be subtracted from the resistance of the string which is measured during operation of the system, thereby arriving at the resistance of the motor during operation. This resistance can then be used to determine the current temperature of the motor using the following equation:

$$\theta_{present}=\theta_{nameplate}+((R_{present}/R_{nameplate})-1)/\alpha$$

where $\theta_{present}$ is the present temperature of the motor, $\theta_{nameplate}$ is the nameplate temperature of the motor, $R_{present}$ is the present resistance of the motor, $R_{nameplate}$ is the nameplate resistance of the motor at the nameplate temperature, and $\alpha$ is the temperature coefficient of the material of the motor windings. The motor temperature determined in this manner can then be reported to a user or it can be used by the controller in the electric drive as an input for controlling operation of the motor.

In another embodiment, the power cable resistance can be used to determine the voltage drop across the cable and the voltage that is ultimately applied to the windings of the electric motor. In this case, the current through the power cable would be determined (e.g., by current sensors that are coupled to the controller of the electric drive). The voltage drop across the power cable would be determined as the product of the measured client and the cable resistance. The computed power cable voltage drop could then be subtracted from the total voltage applied to the cable in order to determine the voltage that is applied to the motor.

The resistance of the string (including the power cable and the motor) can be measured manually by a technician, or this functionality may be included in the electric drive system. In the case of systems that use a step-up transformer, it may be necessary to manually measure the resistance after the motor and power cable have been installed. This is because the electric drive would be coupled to the primary windings of the transformer, rather than the power cable itself, so the drive could potentially measure the resistance of the primary windings, but not the power cable. If the electric drive is coupled directly to the power cable without an intervening transformer, the drive may be configured to measure the resistance of the string.

The power cable resistance, nameplate motor resistance, nameplate temperature, motor winding temperature coefficients, and various other parameters may be provided as inputs to the electric drive system, which may then use these inputs to calculate other parameters, such as the motor temperature or the desired output voltage of the drive (to achieve a desired voltage at the motor). These functions may be implemented in the controller of the electric drive system, the structure of which is illustrated in FIG. 4.

Figure 4:
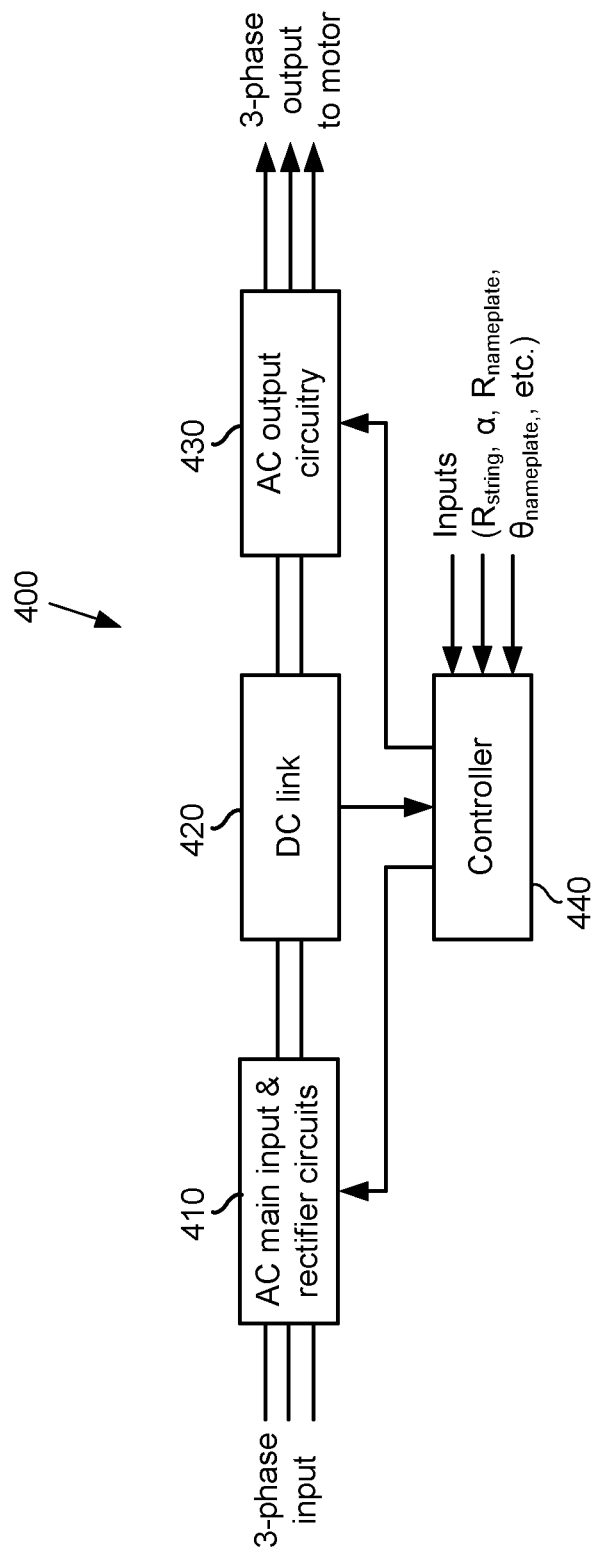
FIG. 4 is a functional block diagram illustrating the structure of an exemplary electric drive for a motor in accordance with one embodiment.

Referring to FIG. 4, a functional block diagram illustrating the structure of an exemplary electric drive for a motor is shown. The electric drive 110 receives AC input power from an external source and generates three-phase output power that is provided to the motor via the power cable. As depicted in this figure, drive system 400 has a converter section that includes input and rectifier circuitry 410 that receives AC input power from the external power source. Circuitry 410 converts the received AC power to DC power and stores this power within the DC link (bus) 420. The power generated by the converter section may have a predetermined voltage level, or it may be variable, as determined by controller 440. The DC link in this embodiment then provides DC power to an inverter section that includes output circuitry 430 which includes a set of IGBT (insulated gate bipolar transistor) switches. The switches of output circuitry 430 are controlled by a motor controller 440 to produce an AC output signal, such as a six-step or PWM waveform. Output circuitry 430 may include filters to modify the generated waveform before it is provided to the motor. For instance, it may be necessary to perform filtering on a PWM waveform in order to prevent damage to the power cable or motor. The signal produced by output circuitry 430 is carried to the downhole electric motor of the lift system via the power cable. As noted above, this system is exemplary, and alternative embodiments may use other technologies (e.g., a matrix converter) to generate the desired output signal from the AC input power.

In the embodiment depicted in FIG. 4, controller 440 is configured to receive a number of inputs that it uses to monitor and manage the output generated by the electric drive. These inputs include the resistance of the power cable and motor string, nameplate resistance of the motor, nameplate temperature of the motor and temperature coefficient of the motor windings. As noted above, these inputs may be manually input to the controller, or the controller may be configured to measure and/or determine these parameters without user intervention. The controller may also receive inputs from appropriate sensors which allow it to monitor such parameters as the voltage and current of the generated output power. Controller 440 can use this information to compute motor speed, motor temperature, and other operating parameters, and can the control output circuitry 430 to generate the desired output waveform to drive the motor.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention as detailed within the following claims.

What is claimed is:

1. A method for determining the resistance of a power cable of an artificial lift system installed in a well, the method comprising:
    determining a temperature of a producing region of a well;
    installing an artificial lift system in the well, wherein an electric motor of the artificial lift system is positioned in the producing region of the well;
    measuring a resistance of the artificial lift system, wherein the resistance of the artificial lift system includes a resistance of the power cable and a resistance of the electric motor, wherein measuring the resistance comprises applying a measurement voltage to the power cable and electric motor, measuring a current drawn by the power cable and electric motor corresponding to the measurement voltage, and calculating the resistance of the artificial lift system as the measurement voltage divided by the current;
    determining the resistance of the electric motor at the temperature of the producing region of the well; and
    determining the resistance of the power cable by subtracting the resistance of the electric motor at the temperature of the producing region of the well from the measured resistance of the artificial lift system.

2. The method of claim 1, wherein determining the temperature of the producing region of the well is performed prior to installing the artificial lift system in the well.

3. The method of claim 1, wherein determining the temperature of the producing region of the well comprises sensing the temperature of the producing region of the well with sensors that are coupled to the electric motor.

4. The method of claim 1, wherein measuring the resistance of the artificial lift system comprises generating the measurement voltage at an electric drive of the artificial lift system wherein the electric drive is positioned at a surface of the well.

5. The method of claim 4, wherein measuring the resistance of the artificial lift system is performed before the artificial lift system is operated.

6. The method of claim 1, wherein measuring the resistance of the artificial lift system comprises manually measuring the resistance of the artificial lift system with an ohmmeter, and wherein the measured resistance of the artificial lift system is provided as an input to a controller in an electric drive of the artificial lift system.

7. The method of claim 1, further comprising operating the artificial lift system in dependence upon the resistance of the power cable.

8. The method of claim 1, wherein determining the resistance of the electric motor at the temperature of the producing region of the well comprises determining a nameplate resistance of the electric motor and multiplying the nameplate resistance by a factor corresponding to a difference between the temperature of the producing region of the well and a nameplate temperature.

9. An artificial lift system comprising:
    a pump;
    a motor coupled to drive the pump;
    an electric drive;
    a power cable coupled between the electric drive and the motor;
    wherein the electric drive is configured to generate output power that is transmitted to the motor via the power cable;

wherein the electric drive includes a controller that is configured to: apply a measurement voltage to the power cable and motor; measure a current drawn by the power cable and electric motor corresponding to the measurement voltage; and calculate a pre-operation total string resistance of the combined power cable and motor as the measurement voltage divided by the current;

wherein the controller receives inputs including a nameplate resistance of the motor, a nameplate temperature of the motor, a temperature coefficient of a winding material of the motor, and a pre-operation downhole temperature at a location in a well at which the motor is installed;

wherein the controller is configured to compute a pre-operation downhole resistance of the motor, and to compute a power cable resistance as the pre-operation total string resistance minus the pre-operation downhole resistance of the motor;

wherein the controller is configured to cause the electric drive to generate the output power at voltages which depend upon the computed power cable resistance.

10. The artificial lift system of claim 9, wherein the pre-operation downhole temperature at the location in the well at which the motor will be installed is determined prior to installing the artificial lift system in the well.

11. The artificial lift system of claim 9, wherein the artificial lift system further comprises one or more sensors that are coupled to the motor, wherein the pre-operation downhole temperature at the location in the well at which the motor is installed is measured by the one or more sensors.

12. The artificial lift system of claim 9, wherein the electric drive is configured to measure the resistance of the artificial lift system by the electric drive generating a voltage, applying the voltage to the power cable and electric motor, measuring a current drawn by the power cable and electric motor, and calculating the resistance of the artificial lift system as the voltage divided by the current.

13. The artificial lift system of claim 12, wherein the resistance of the artificial lift system is determined before the artificial lift system is operated to produce fluids from the well.

14. The artificial lift system of claim 9, wherein the electric drive is configured to receive as an input a manually measured resistance of the artificial lift system.

15. The artificial lift system of claim 9, wherein the controller is configured to receive as inputs a nameplate resistance of the motor, a nameplate temperature of the motor, the pre-operation downhole temperature at the location in the well at which the motor is installed, and a temperature coefficient of a winding material of the motor, wherein the controller is configured to determine the resistance of the installed motor by multiplying the nameplate resistance by a factor corresponding to a difference between the nameplate and downhole temperatures and the temperature coefficient of the winding material.

* * * * *